(12) United States Patent
Matsumoto

(10) Patent No.: US 6,468,447 B2
(45) Date of Patent: Oct. 22, 2002

(54) ELECTROCONDUCTIVE COMPOSITION AND PRINTED CIRCUIT BOARD USING THE SAME

(75) Inventor: Shuji Matsumoto, Omichachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/842,222

(22) Filed: Apr. 25, 2001

(65) Prior Publication Data

US 2001/0042854 A1 Nov. 22, 2001

(30) Foreign Application Priority Data

Apr. 25, 2000 (JP) ........................................ 2000-124303

(51) Int. Cl.$^7$ .......................... H01B 1/16; H05K 1/09; C09D 5/24
(52) U.S. Cl. .................. 252/512; 427/96; 428/901; 174/257
(58) Field of Search .................. 252/512; 106/1.18; 427/96; 428/901; 174/257

(56) References Cited

U.S. PATENT DOCUMENTS

| | | |
|---|---|---|
| 5,413,193 A | 5/1995 | Miller |
| 5,418,193 A | 5/1995 | Tani et al. |
| 5,976,628 A | * 11/1999 | Kawahara et al. ........ 427/383.1 |

FOREIGN PATENT DOCUMENTS

| | | |
|---|---|---|
| JP | 1-167907 | 7/1989 |
| JP | 4-65010 | 3/1992 |
| JP | 4-277406 | * 10/1992 |
| JP | 8-306228 | 11/1996 |
| JP | 10-233119 | * 9/1998 |

OTHER PUBLICATIONS

European Patent Office letter, dated Apr. 11, 2002, regarding Error in Search Report dated Jul. 27, 2001.

* cited by examiner

*Primary Examiner*—Mark Kopec
(74) *Attorney, Agent, or Firm*—Ostrolenk, Faber, Gerb & Soffen, LLP

(57) ABSTRACT

Provided is an electroconductive paste comprising copper powders, a glass powder, and an organic vehicle, wherein: the copper powders comprise (1) from about 50% to 90% by weight of a copper powder A containing from about 1% to 3% by weight of oxygen and having an average particle size of from about 0.9 to 1.5 $\mu$m; and (2) from about 10% to 50% by weight of a copper powder B containing from about 0.2% to 3% by weight of oxygen and having an average particle size of not more than about 0.6 $\mu$m. It has an excellent electroconductivity as well as a sufficiently large bonding strength to a board.

20 Claims, 1 Drawing Sheet

ELECTROCONDUCTIVE COMPOSITION AND PRINTED CIRCUIT BOARD USING THE SAME

BACKGROUND OF THE INVENTION

1. Field of the Invention

The present invention relates to an electroconductive composition mainly composed of copper powders, and also comprising a glass powder, as well as to a printed circuit board using the composition.

2. Description of the Related Art

At present, a thick-film printing technique is being made increasingly practical for making a printed circuit board such as a hybrid IC, wherein an electroconductive paste mainly composed of a copper powder or a silver powder is applied to an insulating board made of glass, ceramic or the like, by a screen printing method or a direct drawing method, followed by baking in order to form the desired circuit pattern (thick-film conductor).

The electroconductive pastes can be classified according to the baking temperature as a high-temperature baking type which can be baked at a temperature in the range of from about 800° C. to about 950° C., or as a medium-temperature baking type which can be baked at a temperature in the range of not more than 750° C., or particularly in the vicinity of 600° C.

While electroconductive pastes belonging to the high-temperature baking type make it possible to form a circuit pattern excellent in conductor characteristics (particularly in electroconductivity) and in adhesion to a board, they need high temperature baking, and therefore may sometimes cause thermal damage to printed resistors, dielectrics, etc. which have been formed beforehand. In comparison, those belonging to the medium-temperature baking type can be baked at a relatively low temperature, and therefore have an advantage that a circuit pattern can be formed while hardly causing thermal damages to the printed resistors, dielectrics, etc., which have been formed beforehand. However, they are somewhat inferior to those belonging to the high-temperature baking type in conductor characteristics and in bonding strength to the board.

In general, an electroconductive paste belonging to the medium-temperature baking type has a metal powder and a glass powder dispersed in an organic vehicle, and forms a sintered metal body by sintering the metal powder at the time of baking. Also, the glass powder turns to be in the liquid state in the course of baking, improving the sintering characteristics of the metal and providing the function of bonding this thick-film conductor to a board. The organic vehicle acts as a liquid medium to regulate the viscosity of the electroconductive paste so as to make these powders printable.

The adhesion of the glass powder to a board by a glass bonding mechanism in which the glass powder melts and moves to the interface between the paste and the board so as to bond the sintered metal body to the board in the course of baking the electroconductive paste. Thus, after the baking, the upper layer part of the thick-film conductor is richer in the metal component and the lower layer part is richer in the glass component, with the result that the glass component is in a state in which it is likened to arms stretching from the surface of the board up through the metal particles, and plays a role of mechanically bonding the board and the thick-film conductor.

Electroconductive pastes mainly composed of a copper powder have been made increasingly practical in recent years. This is because the copper powder has a small wiring resistance and is excellent in migration characteristics, in addition to the fact that it is less expensive in comparison with a silver powder or silver-palladium powders.

It is necessary to maintain the baking of electroconductive pastes mainly composed of a copper powder in a non-oxidizing atmosphere in which the oxygen content is not more than 5 ppm since the copper powder is susceptible to oxidation. However, since it is believed in general that the wetting of a copper powder with a glass occurs with the aid of oxygen, the oxygen content of not more than 5 ppm at the time of baking lowers the wettability of the copper powder with the molten glass, allowing the glass to hinder the sintering of the copper particles, with the result that the strength and the electroconductivity of the thick-film conductor itself after the sintering are lowered sometimes.

SUMMARY OF THE INVENTION

The present invention was achieved in consideration of the above-described circumstances, and one of the objects according to the present invention is to provide an electroconductive composition having an excellent electroconductivity and insuring sufficiently large bonding strength to a board and also to provide a printed circuit board on which a circuit pattern is formed, using this electroconductive composition.

Accordingly, one aspect according to the present invention is an electroconductive composition comprising copper powders and a lead-free glass powder, the copper powders comprising (1) from about 50% to 90% by weight of a copper powder A containing from about 1% to 3% by weight of oxygen, and having an average particle size of from about 0.9 to 1.5 $\mu$m; and (2) from about 10% to 50% by weight of a copper powder B containing from about 0.2% to 3% by weight of oxygen and having an average particle size of not more than about 0.6 $\mu$m.

When the electroconductive composition according to the present invention is used, the wettability between the copper powders and the glass is improved by virtue of the specific amounts of oxygen existing in the copper powders A and B, so that the liquid-phase sintering of the copper powders by the glass is smoothly facilitated, the thick-film conductor thus obtained becomes dense, and the electroconductivity and the bonding strength to the board are increased to a great extent. At the same time, since the copper powder B with a relatively small average particle size is contained at a specific rate, the thick-film conductor can be made sufficiently denser, and its electroconductivity and bonding strength are further improved.

It is noted that when the oxygen content in the copper powder A is less than about 1% by weight, a sufficient bonding strength cannot be obtained since the liquid-phase sintering of the copper powders by the glass does not proceed smoothly, while the conductor resistance becomes larger and the soldering properties are degraded when it exceeds about 3% by weight. Furthermore, when the average particle size of the copper powder A is less than about 0.9 $\mu$m, the bulk density becomes smaller, requiring a larger amount of an organic vehicle to form a paste. On the other hand, when the average particle size exceeds about 1.5 $\mu$m, the sintering properties are degraded.

Also, it is noted that a sufficient bonding strength cannot be obtained when the oxygen content in the copper powder B is less than about 0.2% by weight. This is because the liquid-phase sintering of the copper powders by the glass does not proceed smoothly, as is the case of the copper powder A. On the other hand, the conductor resistance becomes larger, when it exceeds about 3% by weight. Furthermore, when the average particle size of the copper powder B exceeds about 0.6 μm, a thick-film conductor which is dense and has a large bonding strength cannot be obtained since the packing efficiency is not improved sufficiently by mixing the particles of the copper powders A and B.

Furthermore, when the rate of the copper powder A is less than about 50% by weight in the copper powders consisting of the copper powders A and B (in other words, when the rate of the copper powder B exceeds about 50% by weight), the bulk density of the whole copper powder becomes smaller. On the other hand, when the rate of the copper powder A exceeds about 90% by weight (in other words, when the rate of the copper powder B is less than about 10% by weight), the packing efficiency is not improved sufficiently by mixing the particles of the copper powders A and B, thus failing to provide a thick-film conductor with a large bonding strength.

The oxygen content in the copper powder A or B according to the present invention means the amount of the oxygen in the respective entire copper powder expressed in % by weight. The content can be increased, for example, by keeping the powder standing in an oven at about 150° C. for a specific time period, and it can be decreased by subjecting the powder to a reduction treatment in a hydrogen atmosphere. The oxygen content in the copper powder can be analyzed, for example, by an inert gas fusion-infrared ray absorption method or the like as described in Japanese Industrial Standard (JIS) H1067.

Also, the present invention provides a printed circuit board with a specific circuit pattern provided thereon wherein at least part of the circuit pattern is formed with an electroconductive composition according to the present invention.

According to the present invention, a printed circuit board having a circuit pattern with an excellent electroconductivity, as well as with a sufficiently large bonding strength to the board, can be obtained since the circuit pattern is formed with the electroconductive composition according to the present invention. Furthermore, since the electroconductive composition according to the present invention can be baked at a relatively low temperature, a printed circuit board having various good properties as well as excellent reliability can be obtained without providing thermal damage to other circuit elements existing on and in the printed circuit board.

DESCRIPTION OF THE PREFERRED EMBODIMENTS

The electroconductive composition according to the present invention will be explained more in detail below.

In the electroconductive composition according to the present invention, the oxygen content and the average particle size of the copper powder A are preferably from about 1.5% to 2.5% by weight, and from about 1.0 to 1.2 μm, respectively. Also, the oxygen content and the average particle size of the copper powder B are preferably from about 1.0% to 2.0% by weight, and from about 0.3 to 0.5 μm, respectively. Furthermore, it is preferable that the blending rate of the copper powder A be from about 60% to 80% by weight, and the blending rate of the copper powder B be from about 20% to 40% by weight. A good balance between the electroconductivity and the bonding strength can be achieved by controlling the oxygen contents, the average particle sizes and the blending rates in these ranges.

Also, in the electroconductive composition according to the present invention, it is preferable that the glass powder is made of a borosilicate glass which substantially does not contain a Pb component, and contains at least one of $Bi_2O_3$ and ZnO. That is, a $Bi_2O_3$—$B_2O_3$—$SiO_2$ glass powder, a ZnO—$B_2O_3$—$SiO_2$ glass powder or a $Bi_2O_3$—ZnO—$B_2O_3$—$SiO_2$ glass powder is preferable. Since such a glass powder does not contain lead, its environmental burden is small. Furthermore, since the wettability with the copper powders is excellent, the liquid-phase sintering of the copper powders is facilitated smoothly, thus providing a thick-film conductor which is denser and which has a larger bonding strength.

Figure 1:
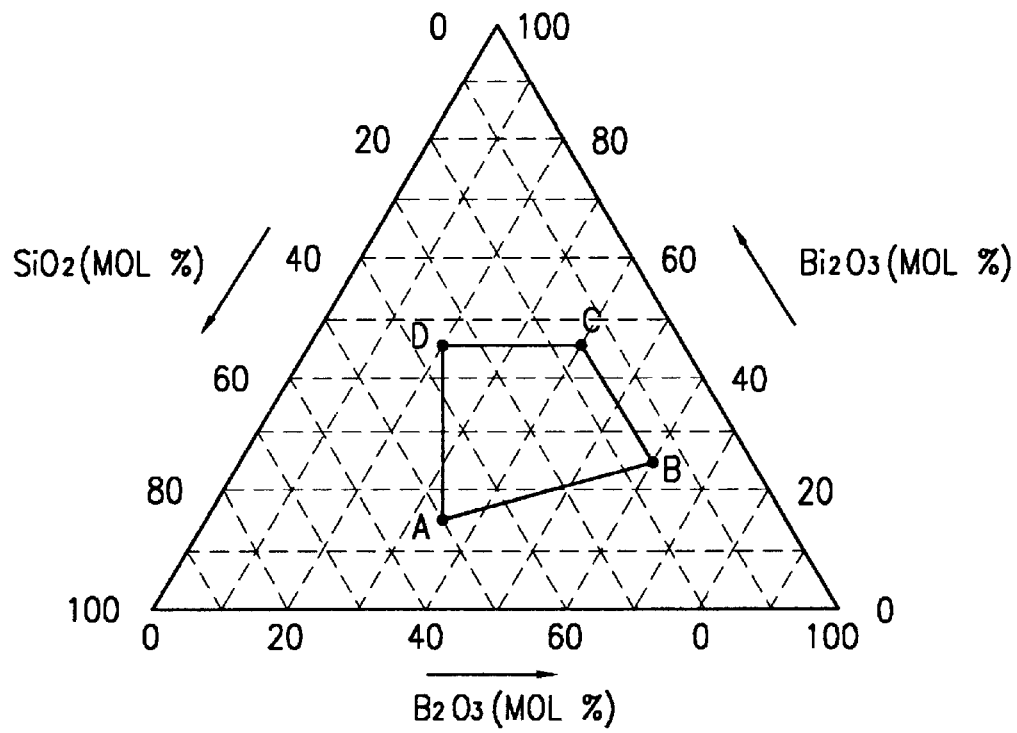
FIG. 1 is a ternary compositional diagram showing a desirable compositional ratio of the $Bi_2O_3$—$B_2O_3$—$SiO_2$ glass according to the present invention.

In particular, it is preferable that the above-described glass powder should comprise a glass component having a composition represented by the formula: $xBi_2O_3$—$yB_2O_3$—$zSiO_2$ (wherein x+y+z=100 mol %), and should have a compositional ratio (x, y, z) lying in the region enclosed by the segments binding the points at A(15, 35, 50), B(25, 60, 15), C(45, 40, 15), and D(45, 20, 35) in the ternary compositional diagram shown in FIG. 1.

A $Bi_2O_3$—$B_2O_3$—$SiO_2$ glass powder which has such a compositional ratio can restrict the raise of the softening point of the glass and can restrict the crystallization of the glass in the course of baking the electroconductive composition, with the result that the effect of its being in the liquid state can be fully utilized so as to improve the sintering characteristics of the copper powders. Accordingly, it is possible to lower the baking temperature without using a lead-containing glass. Thus, a dense thick-film conductor with a large bonding strength can be formed by baking at a medium-range temperature of not more than 700° C., more particularly at about 600° C.

Furthermore, it is more preferable that the glass component having a composition represented by the formula: $xBi_2O_3$—$yB_2O_3$—$zSiO_2$ (wherein x+y+z=100 mol %), should have a compositional ratio (x, y, z) lying in the region enclosed by the segments binding the points at (25, 30, 45), (25, 55, 20), (35, 50, 15) and (35, 25, 40) since it can further improve the sintering characteristics and the bonding strength.

Furthermore, the glass powder in the electroconductive composition according to the present invention, may contain an alkali metal oxide or an alkaline earth metal oxide. In such a case, the alkali metal oxide is preferably not more than about 10 mol % based on the total amount of the glass powder, and the alkaline earth metal oxide is preferably not more than about 20 mol % on the same basis. In these ranges, the softening point of the glass is lowered, and the liquid-phase sintering by the glass can proceed more smoothly.

Also, the glass powder in the electroconductive composition according to the present invention, is preferably contained at a rate of from about 2% to 15% by weight based on the whole electroconductive composition. More preferably, the rate is from about 6% to 10% by weight. Accordingly, a thick-film conductor with a good electroconductivity as well as with a sufficiently large bonding strength to a board can be formed by selecting the glass powder content in the range of from about 2% to 15% by weight based on the whole electroconductive composition. It is noted that when the glass powder content is less than about 2% by weight, the bonding strength to a board is sometimes insufficient. On the other hand, if it exceeds about 15% by weight, soldering properties are degraded sometimes.

Furthermore, it is preferable that the average particle size of the glass powder be in the range of from about 0.1 to 1 $\mu$m. By using the glass powder having such an average particle size, the reactivity between the copper powders and the glass powder is improved so as to improve the sintering characteristics of the copper powders.

Furthermore, formation of pores, etc. can be prevented in the thick-film conductor after the baking, the electroconductivity and the bonding strength can be increased, and the degradation of the strength during thermal aging can be restricted. It is more preferable that the average particle size of the glass powder be in the range of from about 0.4 to 0.7 $\mu$m.

It is preferable that the electroconductive composition according to the present invention further contain an organic vehicle comprising a binder resin and a solvent, and the baking temperature should not be more than 700° C. In other words, by satisfying the compositional requirements described above, an electroconductive paste which can be sintered sufficiently at a temperature of not more than 700° C., or not more than 600° C. in some cases, can be obtained. For example, even when forming a circuit pattern on a ceramic board equipped with thick-film resistors or other elements, a thick-film conductor which has a good electroconductivity as well as a sufficiently large bonding strength to the board can be formed without substantially providing thermal damage to these elements.

When the electroconductive composition according to the present invention is an electroconductive paste comprising a binder resin and a solvent, an ethyl cellulose resin, an alkyd resin, an acrylic resin or the like, can be favorably used as the binder resin, and a terpineol-type solvent or an alcohol-type solvent can be favorably used as the solvent.

Next, preferable embodiments of the printed circuit board according to the present invention will be explained.

Figure 2:
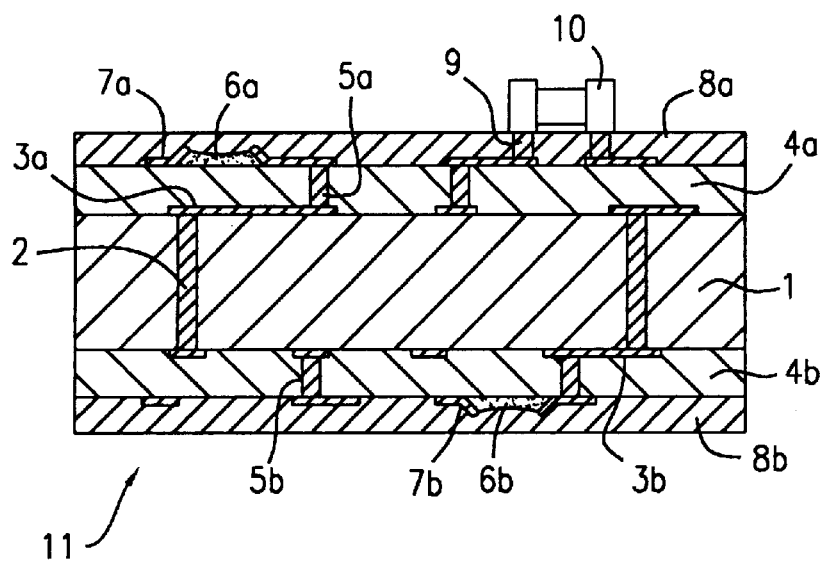
FIG. 2 is a cross-sectional view of a printed circuit board according to the present invention.

As shown in FIG. 2, a printed circuit board 11 is equipped with a base board 1 made of alumina or of a ceramic baked at a low temperature, with first insulating layers 4a and 4b consisting of an amorphous glass, a crystalline glass, a glass ceramic mixture or the like, which are placed over both the top and bottom main surfaces, and with second insulating layers (protective layers) 8a and 8b also consisting of an amorphous glass, a crystalline glass, a glass ceramic mixture or the like, which are placed over the first insulating layers 4a and 4b.

On either of the top and bottom main surfaces of the base board 1 (that is, on either of the interfaces between the base board 1 and the first insulating layers 4a and 4b), first circuit patterns 3a, 3b are formed, respectively. The patterns are mainly composed of Ag or other metals. Parts of the first circuit pattern 3a are electrically connected to parts of the first circuit pattern 3b through the via holes 2 formed in the base board 1. It is noted that the first circuit patterns 3a and 3b include wirings and electrodes.

Also, in the first insulating layers 4a and 4b, via holes 5a and 5b are formed, respectively. Furthermore, thick-film resistors 6a and 6b made of RuO$_2$ or the like are formed on the surfaces of the first insulating layers 4a and 4b (that is, on the interfaces between the first insulating layer 4a and the second insulating layer 8a as well as between the first insulating layer 4b and the second insulating layer 8b, respectively). The thick-film resistors 6a and 6b are electrically connected to parts of the first circuit patterns 3a and 3b, respectively, through the via holes 5a and 5b and through the second circuit patterns 7a and 7b formed on the first insulating layers 4a and 4b. It is noted that the second circuit patterns 7a and 7b are formed with an electroconductive paste according to the present invention, and include wirings and electrodes.

Furthermore, in the printed circuit board 11, mounting parts 10 such as chip-type coils, chip-type capacitors, chip-type resistors, etc. are mounted on the surface of the second insulating layer 8a (that is, on one of the main surfaces of the printed circuit board 11). The mounting parts 10 are electrically connected to the second circuit pattern 7a via the solders 9.

Subsequently, the manufacturing method for the printed circuit board 11 described above will be explained.

First, the base board 1 is prepared. As the base board 1, a baked alumina board, a sintered board made of a ceramic baked at a low temperature or a similar board, can be used with a thickness of about 0.5 mm, for example. Next, holes for via holes are formed in the base board 1 by a laser, by punching or by other methods. Then, the holes for via holes are filled with an electroconductive paste mainly composed of Ag or the like, followed by baking in the air at a temperature of about 850° C. to form the via holes 2 in the base board 1. Next, screen printing is carried out on both the main surfaces of the base board 1 with an electroconductive paste mainly composed of Ag or the like. Then, it is baked in the air at a temperature of about 850° C. to form the first circuit patterns 3a and 3b partly connected to the via holes 2.

Next, screen printing is carried out with an insulating paste mainly composed of an amorphous glass, a crystalline glass, a glass ceramic or the like. Then, the holes for via holes formed at specific locations are filled with an electroconductive paste mainly composed of Ag or the like, followed by baking in the air at a temperature of about 850° C. to form the first insulating layers 4a and 4b having the via holes 5a and 5b.

Next, screen printing is carried out on the surfaces of the first insulating layers 4a and 4b with a resistor paste mainly composed of RuO$_2$ or the like, followed by baking in the air at a temperature of about 850° C. to form thick-film resistors 6a and 6b. Then, screen printing is carried out on the surfaces of the first insulating layers 4a and 4b with an electroconductive paste according to the present invention so that parts thereof are connected to the thick-film resistors 6a and 6b, followed by baking in a non-oxidizing atmosphere (in a nitrogen atmosphere, for example) at a temperature of about 600° C. to form the second circuit patterns 7a and 7b.

Next, screen printing is carried out on the surfaces of the first insulating layers 4a and 4b with an insulating paste, followed by baking in the air at a temperature of about 500° C. to form the second insulating layers 8a and 8b. Furthermore, the solders (for example, cream solders) 9 are placed at specific locations on the second insulating layer 8a, and the mounting parts 10 are mounted, followed by reflowing so as to connect the mounting parts 10 to the second circuit pattern 7a.

As described above, according to the printed circuit board 11, the electroconductive paste according to the present invention is used for forming the second circuit patterns 7a and 7b. Therefore, they can be baked at a temperature of about 600° C., with the result that a printed circuit board can be manufactured with a high reliability and without substantially providing thermal damages to the thick-film resistors 6a and 6b.

The above explanations are made on the printed circuit board 11 according to the present invention. However, the printed circuit board according to the present invention is not limited by the examples described above. For example, the present invention can be applied to a functional module such as a hybrid IC, to a functional package on which semiconductor devices, etc., are mounted, and to other similar devices. More specifically, it can be widely applied to a single-sided printed circuit board, a double-sided printed circuit board, a flexible circuit board, a multilayer ceramic circuit board, etc.

EXAMPLES

The present invention will be explained based on the concrete examples, below.

To begin with, an organic vehicle was added to a mixture of copper powders and a glass powder, followed by kneading them to prepare the electroconductive pastes having the compositions shown in Table 1 below. As the organic vehicle, a mixture was used which had been obtained by adding 80 parts by weight of terpineol to 20 parts by weight of an acrylic resin, followed by mixing.

Next, screen printing was carried out on an alumina board with the electroconductive pastes represented by Sample Nos. 1 to 18 in Table 1 to form coating films with a film thickness of 20 $\mu$m. They were dried at 150° C. for 10 minutes. Then the samples were subjected to baking in an $N_2$ atmosphere (with an oxygen content of not more than 0.5 ppm) at a temperature between 600° C. and 700° C. for one hour to form thick-film conductors (circuit patterns) on the alumina board with the electroconductive pastes.

The thick-film conductors thus formed were subjected to measurements of wiring resistance, initial bonding strength and bonding strength after thermal aging. The results of the measurements are listed in Table 1 together with the compositions of the electroconductive pastes.

In Table 1, the wiring resistance (m$\Omega$/□) is a sheet resistance value obtained by measuring, according to a four-terminal method, the resistance between two points of a thick-film conductor patterned for a circuit, and having a dimensional relationship of the length (L) to the width (W) of 100:1 (L/W=100/1), and by converting the value to the one per unit thickness.

The bonding strength (N) in Table 1 is a value obtained by bonding a lead wire to a thick-film conductor by means of soldering, followed by pulling this lead wire. More particularly, the thick-film conductor having a size of 2 mm×2 mm was immersed in a eutectic solder comprising 2% of silver (Ag) at a regulated temperature of 235±5° C. for 5±1 seconds, and a tin-plated copper wire with a diameter of 0.8 mm as a lead wire was connected to this thick-film conductor by means of soldering. The measurement was performed by pulling this lead wire using a tensile tester at a pulling velocity of 20 mm/min.

As regards the above-described bonding strength, both of the initial bonding strength and the bonding strength after thermal aging are shown in Table 1. Hereupon, the initial bonding strength represents the bonding strength immediately after the soldering of the above-described lead wire, while the bonding strength after thermal aging represents the bonding strength after a specimen is subjected to an aging treatment at a temperature of 150° C. for 1,000 hours.

The results of the judgments of wiring resistances, initial bonding strengths, and strengths after thermal aging are shown in Table 1, respectively. Regarding the wiring resistance, the value of 3.0 m$\Omega$/□ was used as the judging criterion, and the mark ○ was given to those having values not more than the value and the mark × was given to those having values exceeding the value. Regarding the initial bonding strength, the value of 30 N was used as the judging criterion, and the mark ○ was given to those having values not less than the value and the mark × was given to those having values less than the value. Furthermore, regarding the bonding strength after thermal aging, the value of 10 N was used as the judging criterion, and the mark ○ was given to those having values not less than the value and the mark × was given to those having values less than the value.

Also, in Table 1, type "1" glass represents a $Bi_2O_3$—$B_2O_3$—$SiO_2$ glass ($Bi_2O_3$:$B_2O_3$:$SiO_2$=30:40:30 mol %), and type "2" glass represents a ZnO—$B_2O_3$—$SiO_2$ glass (ZnO:$B_2O_3$:$SiO_2$=50:30:20 mol %).

TABLE 1

| Sample No. | Copper powder A Particle size ($\mu$m) | Copper powder A Oxygen Content (wt. %) | Copper powder B Particle size ($\mu$m) | Copper powder B Oxygen Content (wt. %) | Ratio of copper powders A:B | Glass powder Type | Glass powder Amount (wt. %) | Baking temp. (° C.) | Wiring resistance (m$\Omega$/□) | Result | Initial Bonding Strength (N) | Result | Bonding Strength After Aging (N) | Result |
|---|---|---|---|---|---|---|---|---|---|---|---|---|---|---|
| 1 | 1.0 | 2.5 | 0.5 | 1.5 | 70:30 | 1 | 10 | 700 | 2.0 | ○ | 35 | ○ | 15 | ○ |
| 2 | 1.0 | 2.5 | 0.5 | 1.5 | 70:30 | 2 | 10 | 600 | 2.5 | ○ | 33 | ○ | 12 | ○ |
| 3 | 1.0 | 2.5 | 0.5 | 1.5 | 50:50 | 2 | 10 | 600 | 2.7 | ○ | 31 | ○ | 10 | ○ |
| 4 | 1.0 | 2.5 | 0.5 | 1.5 | 90:10 | 2 | 10 | 600 | 2.9 | ○ | 31 | ○ | 11 | ○ |
| 5 | 1.0 | 1.5 | 0.5 | 1.5 | 70:30 | 2 | 10 | 600 | 2.4 | ○ | 33 | ○ | 10 | ○ |
| 6 | 1.0 | 2.5 | 0.5 | 0.5 | 70:30 | 2 | 10 | 600 | 2.4 | ○ | 33 | ○ | 12 | ○ |
| 7 | 1.5 | 2.5 | 0.5 | 1.5 | 70:30 | 2 | 10 | 600 | 2.8 | ○ | 33 | ○ | 10 | ○ |
| 8 | 1.0 | 2.5 | 0.5 | 1.5 | 100:0 | 2 | 10 | 600 | 3.2 | × | 32 | ○ | 7 | × |
| 9 | 1.0 | 0.5 | 0.5 | 1.5 | 70:30 | 2 | 10 | 600 | 4.0 | × | 15 | × | 0 | × |
| 10 | 1.0 | 4.0 | 0.5 | 1.5 | 70:30 | 2 | 10 | 600 | 4.5 | × | 28 | × | 9 | × |
| 11 | 2.0 | 2.5 | 0.5 | 1.5 | 70:30 | 2 | 10 | 600 | 3.0 | ○ | 25 | × | 5 | × |
| 12 | 0.8 | 2.5 | 0.5 | 1.5 | 70:30 | 2 | 10 | 600 | 2.9 | ○ | 32 | ○ | 6 | × |
| 13 | 1.0 | 0.8 | 0.5 | 1.5 | 70:30 | 2 | 10 | 600 | 2.7 | ○ | 29 | × | 4 | × |

TABLE 1-continued

| | Copper powder A | | Copper powder B | | Ratio of | | | | Initial | | Bonding | |
| | Particle | Oxygen | Particle | Oxygen | copper | Glass powder | | Baking | | Bonding | | Strength |
| Sample | size | Content | size | Content | powders | Type | Amount | temp. | Wiring resistance | | Strength | | After Aging | |
| No. | (μm) | (wt. %) | (μm) | (wt. %) | A:B | | (wt. %) | (° C.) | (mΩ/□) | Result | (N) | Result | (N) | Result |
|---|---|---|---|---|---|---|---|---|---|---|---|---|---|---|
| 14 | 1.0 | 2.5 | 0.6 | 1.5 | 70:30 | 2 | 10 | 600 | 3.0 | ○ | 31 | ○ | 10 | ○ |
| 15 | 1.0 | 2.5 | 0.7 | 1.5 | 70:30 | 2 | 10 | 600 | 3.0 | ○ | 30 | ○ | 9 | X |
| 16 | 1.0 | 2.5 | 0.5 | 0.1 | 70:30 | 2 | 10 | 600 | 2.8 | ○ | 29 | X | 7 | X |
| 17 | 1.0 | 2.5 | 0.5 | 4.0 | 70:30 | 2 | 10 | 600 | 5.0 | X | 27 | X | 9 | X |
| 18 | 1.0 | 2.5 | 0.5 | 1.5 | 40:60 | 2 | 10 | 600 | 2.9 | ○ | 30 | ○ | 5 | X |

From Table 1, it is understood that when Sample No. 8 electroconductive paste was used, the wiring resistance was increased and the bonding strength after thermal aging was lowered while the initial bonding strength was excellent. This is because the rate of the copper powder A was excessive (the rate of the copper powder B was too little). On the other hand, when Sample No. 18 electroconductive paste was used, the bonding strength after thermal aging was lowered, while the wiring resistance and the initial bonding strength were excellent. This is because the rate of the copper powder A was too little (the rate of the copper powder B was excessive).

Also, when Sample Nos. 9 and 13 electroconductive pastes were used and the baking was carried out at about 600° C., dense thick-film conductors could not be formed, with increased wiring resistances, as well as with degraded initial bonding strengths and degraded bonding strengths after thermal aging. This is because the oxygen contents in the copper powder A were too little. When Sample No. 10 electroconductive paste was used, both the initial bonding strength and the bonding strength after thermal aging were degraded. This is because the oxygen content in the copper powder A was excessive.

When Sample No. 11 electroconductive paste was used, the initial bonding strength and the bonding strength after thermal aging were degraded. This is because the average particle size of the copper powder A was too large. On the other hand, when Sample No. 12 electroconductive paste was used, the bonding strength after thermal aging was degraded, although the initial bonding strength was excellent. This is because the average particle size of the copper powder A was too small.

Also, when Sample No. 15 electroconductive paste was used, the bonding strength after thermal aging was degraded, although the initial bonding strength was excellent. This is because the average particle size of the copper powder B was too large.

When Sample No. 16 electroconductive paste was used and the baking was carried out at about 600° C., a dense thick-film conductor could not be formed, with a degraded initial bonding strength and a degraded bonding strength after thermal aging. This is because the oxygen content in the copper powder B was too little. When Sample No. 17 electroconductive paste was used, an increased wiring resistance as well as both of the initial bonding strength and the bonding strength after thermal aging were degraded. This is because the oxygen content in the copper powder B was excessive.

In comparison, when Sample Nos. 1 through 7 and 14 electroconductive pastes were used, the circuit patterns formed showed excellent electroconductivity with the wiring resistances as low as not more than 3.0 mΩ/□. Also they showed excellent bonding strength, with the initial bonding strengths of not less than 30 N, and with the bonding strengths after thermal aging of not less than 10 N.

It is noted that the bonding strength to a board was a little degraded when an electroconductive paste having the same composition as Sample No. 2 paste was used except that 1% by weight of the glass powder was added. This is because the amount of the glass powder in the electroconductive paste was too small. On the other hand, the soldering properties were a little degraded, when an electroconductive paste having the same composition as Sample No. 2 paste was used except that 16% by weight of the glass powder was added. This is because the amount of the glass powder in the electroconductive paste was too large.

That is, by using an electroconductive paste comprising not less than about 50% by weight and not more than about 90% by weight, based on the entire copper powders, of a copper powder A containing not less than about 1.0% by weight and not more than about 3.0% by weight of oxygen and having an average particle size of not less than about 0.9 μm and not more than about 1.5 μm, and also comprising not more than about 50% by weight and not less than about 10% by weight, based on the entire copper powders, of a copper powder B containing not less than about 0.2% by weight and not more than about 3% by weight of oxygen and having an average particle size of not more than about 0.6 μm, it was possible to improve the wettability between the copper powders and the glass, to improve the sintering properties of the copper powders, to increase the strength of the sintered film itself and to restrict degradation of the bonding strength after thermal aging, even when the baking was carried out at a low oxygen content.

The electroconductive composition according to the present invention contains copper powders and a glass powder, the copper powders comprising: (1) from about 50% to 90% by weight of a copper powder A containing from about 1% to 3% by weight of oxygen, and having an average particle size of from about 0.9 to 1.5 μm; and (2) from about 10% to 50% by weight of a copper powder B containing from about 0.2% to 3% by weight of oxygen and having an average particle size of not more than about 0.6 mm. Accordingly, by virtue of the specific amounts of oxygen existing in the copper powders A and B, the wettability between the copper powders and the glass is improved, the liquid-phase sintering of the copper powders is facilitated smoothly, the thick-film conductor thus obtained is dense and the electroconductivity and the bonding strength are greatly improved. At the same time, the thick-film conductor can be made sufficiently denser, with further improved electroconductivity and bonding strength, since the paste contains the copper powder B with a relatively small average particle size at a certain rate.

Also, a printed circuit board according to the present invention is a printed circuit board with a circuit pattern provided thereon, wherein at least part of the circuit pattern is formed with an electroconductive composition according to the present invention. Accordingly, a printed circuit board can be obtained with a circuit pattern having an excellent electroconductivity as well as a sufficiently large bonding strength to the board. Furthermore, since the electroconductive composition according to the present invention can be baked at a relatively low temperature, a printed circuit board can be manufactured with various good characteristics, with an excellent reliability and without providing thermal damages to the printed circuit board itself as well as to other circuit elements.

What is claimed is:

1. An electroconductive composition comprising copper powder and glass powder, wherein said copper powder comprises:
    (a) from about 50% to 90% by weight of a copper powder A containing from about 1% to 3% by weight of oxygen and having an average particle size of from about 0.9 to 1.5 $\mu$m; and
    (b) from about 10% to 50% by weight of a copper powder B containing from about 0.2% to 3% by weight of oxygen and having an average particle size of not more than about 0.6 $\mu$m; and
    wherein said glass powder is substantially lead free.

2. An electroconductive composition according to claim 1, wherein said glass powder comprises a borosilicate glass which contains at least one of $Bi_2O_3$ and ZnO.

3. An electroconductive composition according to claim 2, wherein said glass has a composition represented by the formula $xBi_2O_3$—$yB_2O_3$—$zSiO_2$ in which $x+y+z=100$ mol % and has a (x, y, z) composition lying in the region enclosed by the lines connecting points A(15, 35, 50), B(25, 60, 15), C(45, 40, 15) and D(45, 20, 35) in a ternary compositional diagram.

4. An electroconductive composition according to claim 3, wherein said (x, y, z) composition is in the region enclosed by the lines connecting points A'(15, 35, 50), B'(25, 60, 15), C(45, 40, 15), and D(45, 20, 35).

5. An electroconductive composition according to claim 4, wherein said glass powder concentration is from about 2% to 15% by weight based on the total amount of said electroconductive composition.

6. An electroconductive composition according to claim 5, wherein said glass powder has an average particle size in the range of from about 0.1 to 1 $\mu$m.

7. An electroconductive composition according to claim 6, wherein said glass powder is from about 6% to 10% by weight based on the total amount of said electroconductive composition and said glass powder has an average particle size in the range of from about 0.4 to 0.7 $\mu$m.

8. An electroconductive composition according to claim 1, wherein said glass powder is from about 2% to 15% by weight based on the total amount of said electroconductive composition.

9. An electroconductive composition according to claim 1, wherein said glass powder has an average particle size in the range of from about 0.1 to 1 $\mu$m.

10. An electroconductive composition according to claim 1, wherein said electroconductive composition further comprises an organic vehicle comprising a binder resin and a solvent, and has a baking temperature of not more than about 700° C.

11. A printed circuit board having a circuit pattern thereon, wherein at least part of said circuit pattern comprises an electroconductive composition according to claim 10.

12. A printed circuit board having a circuit pattern thereon, wherein at least part of said circuit pattern comprises an electroconductive composition according to claim 9.

13. A printed circuit board having a circuit pattern thereon, wherein at least part of said circuit pattern comprises an electroconductive composition according to claim 8.

14. A printed circuit board having a circuit pattern thereon, wherein at least part of said circuit pattern comprises an electroconductive composition according to claim 7.

15. A printed circuit board having a circuit pattern thereon, wherein at least part of said circuit pattern comprises an electroconductive composition according to claim 6.

16. A printed circuit board having a circuit pattern thereon, wherein at least part of said circuit pattern comprises an electroconductive composition according to claim 5.

17. A printed circuit board having a circuit pattern thereon, wherein at least part of said circuit pattern comprises an electroconductive composition according to claim 4.

18. A printed circuit board having a circuit pattern thereon, wherein at least part of said circuit pattern comprises an electroconductive composition according to claim 3.

19. A printed circuit board having a circuit pattern thereon, wherein at least part of said circuit pattern comprises an electroconductive composition according to claim 2.

20. A printed circuit board having a circuit pattern thereon, wherein at least part of said circuit pattern comprises an electroconductive composition according to claim 1.

* * * * *